United States Patent
Ok et al.

(10) Patent No.: US 10,390,441 B1
(45) Date of Patent: Aug. 20, 2019

(54) METHOD FOR PROVIDING HERMETIC ELECTRICAL FEEDTHROUGH

(75) Inventors: Jerry Ok, Canyon Country, CA (US); Honggang Jiang, Valencia, CA (US)

(73) Assignee: Second Sight Medical Products, Inc., Sylmar, CA (US)

( * ) Notice: Subject to any disclaimer, the term of this patent is extended or adjusted under 35 U.S.C. 154(b) by 504 days.

(21) Appl. No.: 12/473,935

(22) Filed: May 28, 2009

Related U.S. Application Data

(60) Provisional application No. 61/056,765, filed on May 28, 2008.

(51) Int. Cl.
| | |
|---|---|
| *H05K 3/46* | (2006.01) |
| *H05K 3/12* | (2006.01) |
| *B32B 37/14* | (2006.01) |
| *H05K 3/40* | (2006.01) |
| *H05K 1/03* | (2006.01) |

(52) U.S. Cl.
CPC ........... *H05K 3/4623* (2013.01); *B32B 37/14* (2013.01); *H05K 3/1233* (2013.01); *H05K 3/4061* (2013.01); *H05K 1/0306* (2013.01); *H05K 3/4614* (2013.01); *H05K 3/4629* (2013.01); *H05K 2203/1147* (2013.01); *H05K 2203/308* (2013.01); *Y10T 156/10* (2015.01)

(58) Field of Classification Search
CPC .. H05K 3/4623; H05K 3/4061; H05K 3/1233; H05K 3/4614; H05K 3/4629; H05K 2203/1147; H05K 2203/308; H05K 1/0306; B32B 37/14; Y10T 156/10
USPC .............. 216/18; 174/50.6; 156/89.12, 89.11
See application file for complete search history.

(56) References Cited

U.S. PATENT DOCUMENTS

| | | | | |
|---|---|---|---|---|
| 3,871,853 A | * | 3/1975 | Dietz et al. ..................... 65/32.5 |
| 3,876,560 A | * | 4/1975 | Kuo et al. ...................... 252/514 |
| 4,325,710 A | * | 4/1982 | Tanaka .................. B23B 27/148 |
| | | | | 264/676 |
| 4,439,248 A | * | 3/1984 | Herchenroeder ..... F27D 1/0006 |
| | | | | 148/280 |
| 4,493,789 A | * | 1/1985 | Ueyama ................ B22F 3/1003 |
| | | | | 252/512 |
| 4,732,780 A | * | 3/1988 | Mitoff et al. .................. 427/125 |
| 5,109,844 A | | 5/1992 | de Juan, Jr. et al. |
| 5,274,916 A | * | 1/1994 | Kawabata et al. .............. 29/848 |
| 5,302,219 A | * | 4/1994 | Hargis ........................ 156/89.15 |
| 5,470,412 A | * | 11/1995 | Fukuta et al. ............. 156/89.15 |
| 5,604,018 A | * | 2/1997 | Horiuchi et al. ............. 428/210 |
| 5,935,155 A | | 8/1999 | Humayun et al. |
| 6,041,496 A | * | 3/2000 | Haq et al. ........................ 29/852 |
| 6,190,582 B1 | | 2/2001 | Marlowe |
| 6,400,989 B1 | | 6/2002 | Eckmiller |
| 6,458,157 B1 | | 10/2002 | Suaning |
| 6,803,093 B2 | * | 10/2004 | De La Prieta et al. ....... 428/210 |

(Continued)

*Primary Examiner* — Anita K Alanko
(74) *Attorney, Agent, or Firm* — Scott Dunbar

(57) ABSTRACT

This invention provides methods for processing of platinum metallized high temperature co-fired ceramic (HTCC) components with minimum deleterious reaction between platinum and the glass constituents of the ceramic-glass body. The process comprises co-firing a multilayer laminate green ceramic-glass body with via structures filled with a platinum powder-based material in a reducing atmosphere with a specified level of oxygen partial pressure. The oxygen partial pressure should be maintained above a minimum threshold value for a given temperature level.

16 Claims, 9 Drawing Sheets

(56) References Cited

U.S. PATENT DOCUMENTS

| | | | |
|---|---|---|---|
| 7,084,350 B2* | 8/2006 | De La Prieta et al. | 174/169 |
| 7,901,761 B1* | 3/2011 | Jiang et al. | 428/210 |
| 2002/0139556 A1* | 10/2002 | Ok et al. | 174/50.6 |
| 2003/0094307 A1* | 5/2003 | Saito | H01L 23/49883 |
| | | | 174/262 |
| 2005/0013989 A1* | 1/2005 | Hirose et al. | 428/323 |
| 2008/0314502 A1 | 12/2008 | Ok et al. | |

* cited by examiner

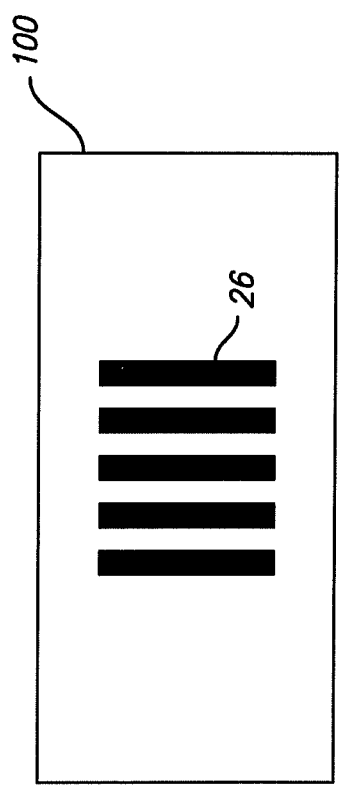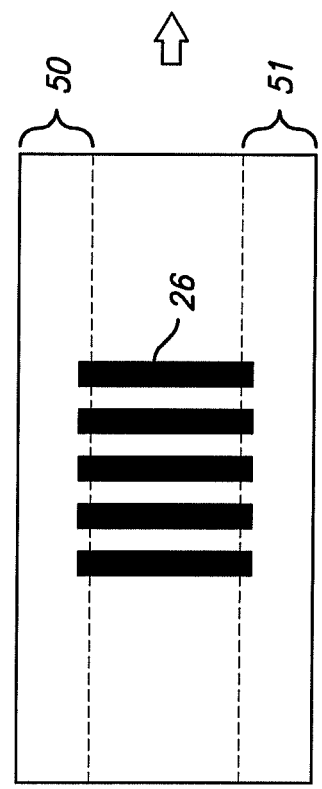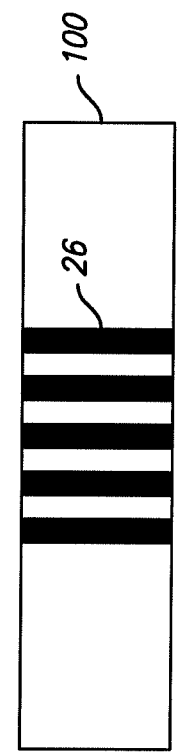

METHOD FOR PROVIDING HERMETIC ELECTRICAL FEEDTHROUGH

CROSS REFERENCE TO RELATED APPLICATIONS

This application claim priority to U.S. provisional patent application 61/056,765, for Method for Providing Hermetic Electrical Feedthrough, filed May 28, 2008. This application is related to U.S. Provisional Patent Application Ser. No. 60/946,086, filed Jun. 25, 2007 for Method and Apparatus for Providing Hermetic Electrical Feedthrough; U.S. patent application Ser. No. 11/875,198, filed Oct. 19, 2007, for Method for Providing Hermetic Electrical Feedthrough; U.S. patent application Ser. No. 09/823,464, filed Mar. 30, 2001 for Method and Apparatus for Providing Hermetic Electrical Feedthrough, the disclosures of which is incorporated herein by reference.

FEDERALLY SPONSORED RESEARCH OR DEVELOPMENT

The present disclosure was made with support from the United States Government under Grant number R24EY12893-01, awarded by the National Institutes of Health. The United States Government has certain rights in the invention.

FIELD

The present disclosure relates generally to a method and apparatus for providing electrical feedthroughs and more particularly to a method and apparatus suitable for forming hermetic electrical feedthroughs through a ceramic sheet.

BACKGROUND

Various approaches are described in the literature for fabricating hermetically sealed electrical circuit housings suitable for extended operation in corrosive environments, e.g., in medical devices implanted in a patient's body. For such applications, a housing must be formed of biocompatible and electrochemically stable materials and typically must include a wall containing multiple hermetic electrical feedthroughs. A hermetic electrical feedthrough is comprised of electrically conductive material which extends through and is hermetically sealed in the wall material.

One known approach uses an assembled pin feedthrough consisting of a conductive pin that is bonded chemically at its perimeter through brazing or the use of oxides, and/or welded, and/or mechanically bonded through compression to a ceramic body. Typically, gold is used as a braze material that wets the feedthrough pin and the ceramic body resulting in a hermetic seal. Wetting to the ceramic body requires a deposited layer of metal such as titanium. This layer acts additionally as a diffusion barrier for the gold.

Other alternative feedthrough approaches use a metal tube cofired with a green ceramic sheet. The hermeticity of the metal/ceramic interface is achieved by a compression seal formed by material shrinkage when the assembly is fired and then allowed to cool. The use of a tube inherently limits the smallest possible feedthrough to the smallest available tubing. Acceptable results have been reported only when using tubes having a diameter >40 mils in ceramic substrates at least 70 mils thick. High temperature co-fired ceramics (HTCCs) are typically constructed with tungsten-based metallization fired in reducing atmosphere. When the tungsten is replaced with platinum, particularly in filled vias, the firing process is complicated by the undesired interaction of platinum with the ceramic-glass system. A platinum system has a greater thermodynamic tendency than does tungsten towards reduction of silica resulting in the volatilization of silicon monoxide and the formation of low melting temperature platinum silicides. These reactions respectively lead to devitrification of glass and abnormal microstructure evolution in liquid phase sintering ultimately producing the following functional defects: loss of via hermeticity, loss of electrical continuity, and loss of high temperature stability.

Additionally, since platinum is more resistant to oxidation than is tungsten, a platinum-based system may be fired in an atmosphere that would be considered oxidizing (i.e. air). However, in an oxidizing environment, the formation of volatile platinum oxides would be possible at high temperatures. This would lead to the following functional defects: loss of hermeticity and loss of high temperature stability.

SUMMARY

This invention provides methods for processing of platinum metallized high temperature co-fired ceramic (HTCC) components with minimum deleterious reaction between platinum and the glass constituents of the ceramic-glass body. The process comprises co-firing a multilayer laminate green ceramic-glass body with via structures filled with a platinum powder-based material in a reducing atmosphere with a specified level of oxygen partial pressure. The oxygen partial pressure should be maintained above a minimum threshold value for a given temperature level.

The initiation of the undesired effects mentioned above can be primarily traced to the reduction of silicon dioxide. Though there are additional likely intermediary products and reactants, the following chemical equation summarizes the overall reaction: $SiO_2 \rightarrow Si + O_2$ As suggested in the problem statement, replacement of tungsten by platinum in HTCC increases the thermodynamic tendency of this reduction reaction. The presence of platinum under typical dry reducing firing conditions in effect catalyzes the above reduction due to its high affinity for interaction with silicon. However, it is at least conceptually plausible that an increase in the amount of available oxygen would drive the system to equilibrate itself towards the stable oxide. Indeed a more rigorous analysis of the equation of reaction equilibrium shows that at a given temperature the Gibb's free energy change is shifted increasingly positive with increasing oxygen partial pressure (i.e. partial molar free energy). Additionally, the thermodynamic activity coefficient for silicon dioxide in molten glass affects the Gibb's free energy change inversely. It follows that decreasing this activity coefficient by appropriate choice of glass materials would also shift the Gibb's free energy change in the positive direction.

Therefore the desired manipulation of the Gibb's free energy state of the system may be achieved in the following ways:

1. Control of oxygen partial pressure in the firing atmosphere to exceed the threshold required for equilibrium at a given temperature. This can be with a gas mixture of the group consisting of $CO_2/CO$, $CO_2/NH_3$, $CO_2/H_2$, $H_2O/H_2$, $H_2O/NH_3$, $H_2O/CO$, Nitrogen, Argon, and vacuum (partial pressure of oxygen $10^{-38}$ atm to $10^{-3}$ atm)
2. Choice of glass constituents such that the thermodynamic activity of silicon dioxide in the glass is less a maximum at which the Gibb's free energy change for the system is zero.

This invention additionally provides methods for processing of platinum metallized high temperature co-fired ceramic (HTCC) components with minimum deleterious formation of volatile platinum oxide products.

The initiation of the undesired effects mentioned above can be traced to the formation of a volatile platinum oxide. The following relationship represents the thermodynamic equilibrium between the metal, oxygen, and gaseous oxide:

$$x\text{Pt} + \frac{1}{2}y\text{O}_2 \rightleftharpoons \text{Pt}_y\text{O}_y$$

The desired manipulation of the Gibb's free energy state of the system may be achieved in the following ways:
1. It is preferred to minimize the partial pressure of oxygen as low as possible to limit the thermodynamic tendency for the gaseous platinum oxide formation (i.e. Manipulate the sign of the Gibbs free energy change increasingly positive). An oxygen partial pressure less than $10^{-3}$ atm is desired. However, even though this number is exceeded, it is advantageous to have an oxygen partial pressure less than in atmospheric air.
2. Another approach is to include an additional platinum oxide gas generating source into the furnace during firing of platinum via parts. For example, a prefired ceramic substrate with sputtered platinum layer or a ceramic crucible with fine platinum powder may be used. This would cause additional platinum oxide gas to be formed in the chamber minimizing the degradation of the platinum contained in the fabricated part. The amount and geometric configuration of this 'sacrificial' platinum may be tailored such that degradation occurs preferentially on the 'sacrificial' platinum over the component platinum.

The mechanical system is able to accommodate some deleterious reaction occurring when the oxygen partial pressure is outside a theoretical range either toward the reducing side or the oxidizing size. The degree of the deviation will determine the amount of undesired phenomena. Even moderate changes in the Gibb's free energy state of the system may yield measureable differences in the fabricated part.

Additionally it should be mentioned that temperature is also an important parameter in the firing process. Temperature may also be used to favorably manipulate the free energy state of the reactions.

Further embodiments are shown in the specification, drawings and claims of the present application.

BRIEF DESCRIPTION OF THE FIGURES

FIGS. 4-6 respectively depict the fabrication stages of a feedthrough assembly in accordance with the process flow illustrated in FIG. 3, wherein

FIG. 6A shows an exemplary laminated substrate;

FIGS. 6B-C depict lapping/grinding process; and

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

The present disclosure is directed to a method and apparatus suitable for forming hermetic electrical feedthroughs in a ceramic sheet (or substrate) having a possible thickness of 540 mils. More particularly, the disclosure is directed to a method and apparatus for forming a structure including a hermetic electrical feedthrough which is both biocompatible and electrochemically stable and suitable for implantation in a patient's body.

Electrical feedthroughs in accordance with the present writing are intended to function in corrosive environments, e.g., in medical devices intended for implantation in a patient's body. In such applications, it is generally critical that the device housing be hermetically sealed which, of course, requires that all feedthroughs in the housing wall also be hermetic. In such applications, it is also generally desirable that the weight and size of the housing be minimized and that all exposed areas of the housing be biocompatible and electrochemically stable. Biocompatiblity assures that the implanted device has no deleterious effect on body tissue. Electrochemical stability assures that the corrosive environment of the body has no deleterious effect on the device. Ceramic and platinum materials are often used in implantable medical devices because they typically exhibit both biocompatibility and electrochemical stability.

Embodiments constructed in accordance with the present disclosure are able to achieve very high feedthrough density. For example, in applications where miniaturization is important, the feedthrough pitch, i.e., center-to-center distance between adjacent feedthroughs may be from 10 mils to 40 mils.

Figure 1:
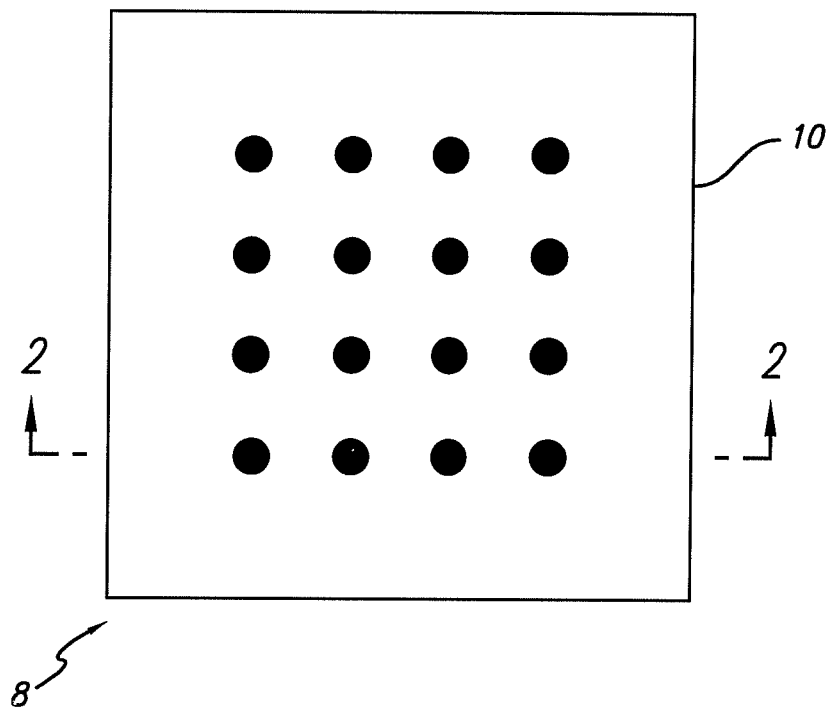
FIG. 1 depicts a top view of a finished feedthrough assembly in accordance with the present disclosure comprised of a ceramic sheet having electrically conductive vias extending therethrough.
Figure 2:
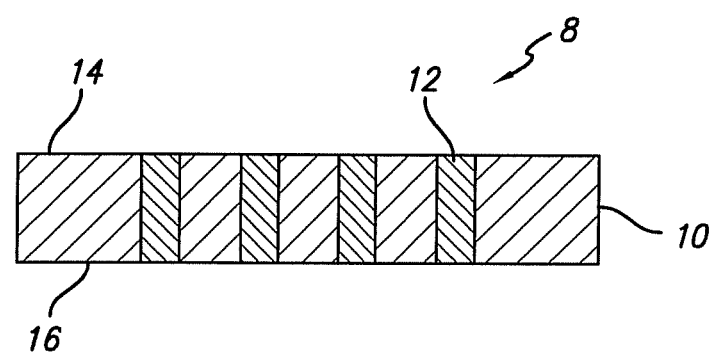
FIG. 2 depicts a sectional view taken substantially along the plane 2-2 of FIG. 1 showing the electrically conductive vias ends flush with the surfaces of the ceramic sheet.

Attention is initially directed to FIGS. 1 and 2 which depict a preferred feedthrough assembly 8 in accordance with the present disclosure comprising a thin ceramic sheet 10 of ceramic material having multiple electrical feedthroughs 12 extending therethrough terminating flush with the upper and lower surfaces 14, 16 of sheet 10. The sheet 10 typically comprises a wall portion of a housing (not shown) for accommodating electronic circuitry. The feedthroughs 12 function to electrically connect devices external to the housing, e.g., adjacent to surface 14, to electronic circuitry contained within the housing, e.g., adjacent to surface 16. "Thin ceramic sheet" as used herein refers to a sheet having a finished thickness dimension of ≤40 mils, i.e., 1 mm. The apparatus in accordance with the disclosure is particularly suited for use in corrosive environments such as in medical devices implanted in a patient's body.

The present disclosure is directed to providing electrical feedthroughs that are compatible with thin ceramic sheets (or substrates) having a finished thickness of ≤40 mils, and with feedthroughs that are hermetic, biocompatible, and electrochemically stable. In one exemplary embodiment, the ceramic sheet 10 may be formed of 90% aluminum oxide ($AlO_2$) and the feedthroughs 12 may have a diameter of ≤20 mils and may be composed of paste containing, for example, platinum.

Attention is now directed to FIGS. 3 and 4A-6E which depict the possible process steps for fabricating the finished feedthrough assembly 8 illustrated in FIGS. 1 and 2.

Figure 3:
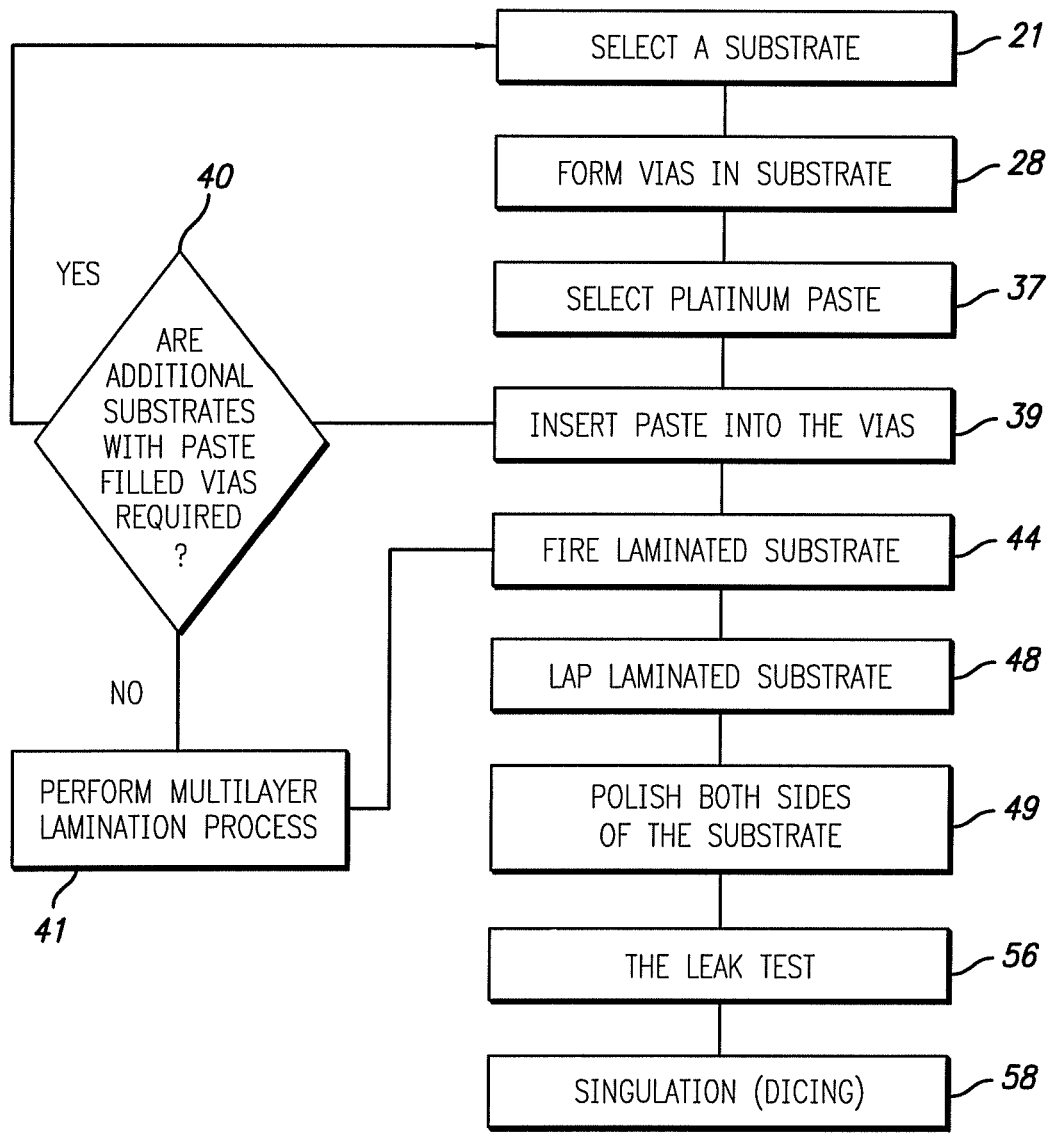
FIG. 3 depicts a flow diagram illustrating a possible series of process steps for fabricating a feedthrough assembly in accordance with the present disclosure.

Initially, a green ceramic sheet/tape/substrate 20 (FIG. 4A), formed, for example, of >90% aluminum oxide ($AlO_2$) is selected as represented by step 21 in FIG. 3. In an exemplary embodiment, the sheet 20 may have a thickness of 40 mils or less. "Green ceramic sheet/tape/substrate" as used herein refers to an unfired ceramic sheet, tape or substrate.

Figure 4A:
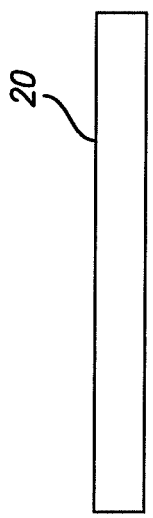
FIG. 4A depicts a sectional view of a ceramic sheet.
Figure 4B:
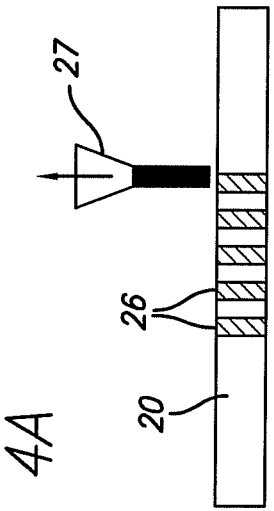
FIGS. 4B-C depict via holes being punched in the sheet of FIG. 4A.
Figure 4C:
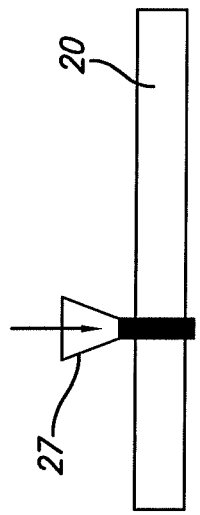

Via holes 26 are formed into the sheet 20 as represented by FIGS. 4B-4C and step 28 in FIG. 3. In an exemplary embodiment, each via hole 26 may be punched in to the sheet 20 using, for example, programmable punch tool 27. In one exemplary embodiment, a plurality of via holes 26 may be punched at the same time. It is to be understood that other methods may be used to form via holes 26. For Example, via holes 26 may be formed using solvent etching, laser ablation, and/or via holes 26 may be drilled.

Step 37 of FIG. 3 calls for selecting a conductive thickfilm paste 17 to fill in via holes 26 depicted in FIG. 4C. "Thickfilm paste" as used herein refers to a material containing inorganic particles dispersed in a vehicle comprising an organic resin and a solvent. Types of different pastes are disclosed in U.S. Pat. No. 5,601,638, the disclosure of which is incorporated herein by reference.

Figure 4D:
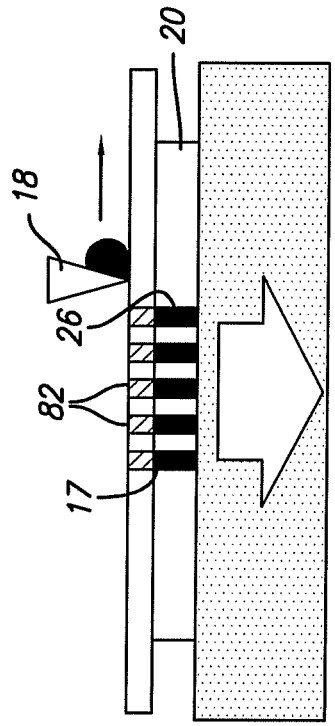
FIGS. 4D-E depict exemplary stencil printing with vacuum pull down process.
Figure 4E:
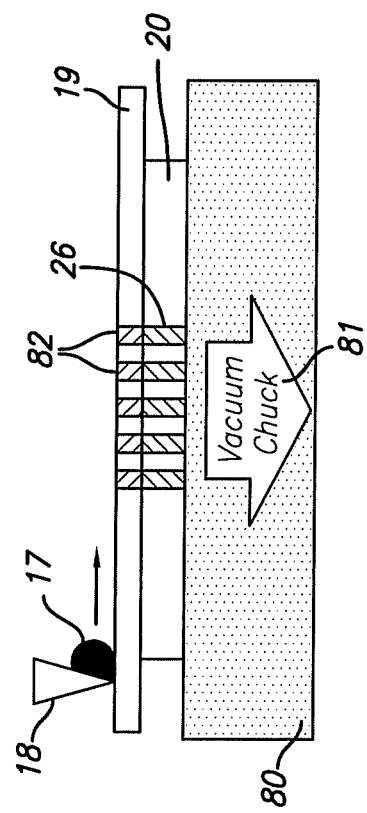

In one exemplary embodiment, a stencil printing with vacuum pull down process may be used to fill via holes 26 with the conductive paste 17 as represented by FIGS. 4D-4E and step 39 in FIG. 3. During the stencil printing with vacuum pull down process, the sheet 20 may sandwiched between a stencil layer 19 and a vacuum base 80. As a squeegee 18 roles the conductive paste 17 across the stencil layer 19, a vacuum chuck 81 of the vacuum base 80 pulls the conductive paste 17 through holes 82 of the stencil layer 19 and into the via holes 26 as shown in FIGS. 4D-4E.

Step 40 of FIG. 3 calls for determining if additional green ceramic sheet/tape/substrates with paste filled via holes are required. If additional green ceramic sheet/tape/substrates with paste filled via holes are required ("Yes" in step 40), steps 21, 28, 37 and 39 are repeated. If additional green ceramic sheet/tape/substrates with paste filled via holes are not required ("No" in step 40), step 41 of FIG. 3 is performed.

Figure 5A:
FIG. 5A depicts paste inserted into the via holes.
Figure 5C:
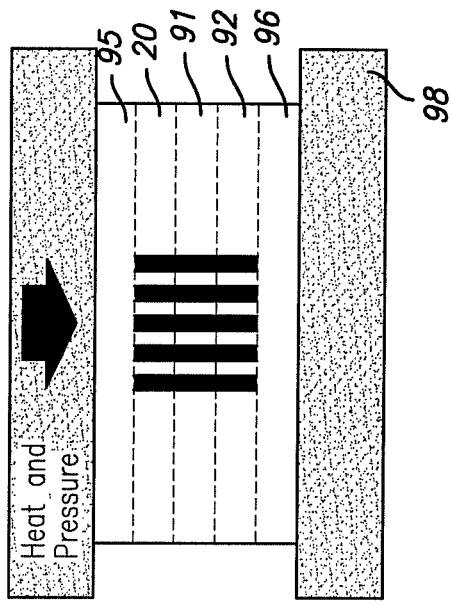
FIGS. 5B-C depict exemplary multilayer lamination process.
Figure 5B:
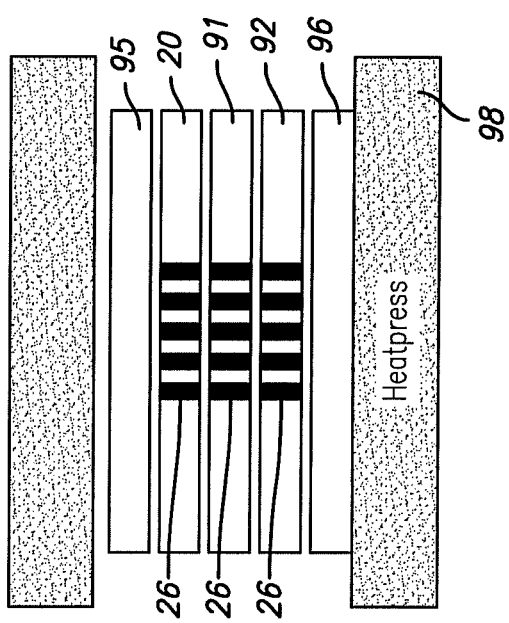

Upon completion of the stencil printing with vacuum pull down process and step 40, the sheet 20 with via holes 26 filled with conductive paste 17 shown in figure FIG. 5A may go through a multilayer lamination process as represented by FIGS. 5B-5C and step 41 in FIG. 3.

In the multilayer lamination process, the sheet 20 of FIG. 5A may be laminated with, for example, sheets 91 and 92 as shown in FIG. 5B. The sheets 91 and 92 may contain conductive paste filled vias 26 that are similar to the conductive paste filled vias 26 of the sheet 20 and the sheets 91 and 92 may be formed using steps 21, 28, 37 and 39 of FIG. 3 as described above.

During the multilayer lamination process, a) the sheets 20, 91 and 92 are stacked on top of each other with conductive paste filled vias 26 of each sheet being aligned on top of each other; b) stacked sheets 20, 91 and 92 are sandwiched between two unpunched green ceramic sheets/tapes/substrates 95 and 96; and c) the sheets 20, 91 and 92 and the sheets 95 and 96 are laminated together using a heatpress 98 to create laminated substrate 100 shown in FIG. 6A.

Although FIGS. 5B and 5C laminate three sheets 20, 91 and 92 with conductive paste filled vias 26, one skilled in the art can appreciate that this disclosure is not limited to three sheets and that a single sheet 20 with conductive paste filled vias may be laminated together with the sheets 95 and 96 without the additional sheets 91 and 92. Although FIGS. 5B and 5C laminate three sheets 20, 91 and 92 with conductive paste filled vias 26, one skilled in the art can appreciate that this disclosure is not limited to three sheets and that additional sheets with conductive paste filled vias may also be laminated together with sheets 20, 91 and 92.

Step 44 of FIG. 3 calls for the laminated substrate 100 to be fired. Firing of the laminated substrate 100 encompasses different aspects of forming bonds in ceramic (evaporation, binder burnout, sintering, etc.). The unpunched ceramic layers 95 and 96 of the laminated substrate 100 help to constrain the conductive paste within via holes 26 and allow for compression during the firing step 44. The unpunched ceramic layers 95 and 96 of the laminated substrate 100 also help to isolate the conductive paste filled vias 26 from the firing atmosphere during the step 44 which may be the key to hermetic and low resistance paste filled vias 26. An exemplary firing schedule includes ramping the laminated substrate 100 of FIG. 6A up to 600° C. at a rate of 1° C./minute, then ramping up to 1600° C. at a rate at 5° C./minute, followed by a one hour dwell and then a cool-to-room-temperature interval.

This invention provides methods for processing of platinum metallized high temperature co-fired ceramic (HTCC) components with minimum deleterious reaction between platinum and the glass constituents of the ceramic-glass body. The process comprises co-firing a multilayer laminate green ceramic-glass body with via structures filled with a platinum powder-based material in a reducing atmosphere with a specified level of oxygen partial pressure. The oxygen partial pressure should be maintained above a minimum threshold value for a given temperature level.

The initiation of the undesired effects mentioned above can be primarily traced to the reduction of silicon dioxide. Though there are additional likely intermediary products and reactants, the following chemical equation summarizes the overall reaction: $SiO_2 \rightarrow Si + O_2$ As suggested in the problem statement, replacement of tungsten by platinum in HTCC increases the thermodynamic tendency of this reduction reaction. The presence of platinum under typical dry reducing firing conditions in effect catalyzes the above reduction due to its high affinity for interaction with silicon. However, it is at least conceptually plausible that an increase in the amount of available oxygen would drive the system to equilibrate itself towards the stable oxide. Indeed a more rigorous analysis of the equation of reaction equilibrium shows that at a given temperature the Gibb's free energy change is shifted increasingly positive with increasing oxygen partial pressure (i.e. partial molar free energy). Additionally, the thermodynamic activity coefficient for silicon dioxide in molten glass affects the Gibb's free energy change inversely. It follows that decreasing this activity coefficient by appropriate choice of glass materials would also shift the Gibb's free energy change in the positive direction. Therefore the desired manipulation of the Gibb's free energy state of the system may be achieved in the following ways:

1. Control of oxygen partial pressure in the firing atmosphere to exceed the threshold required for equilibrium at a given temperature. This can be with a gas mixture of the group consisting of $CO_2/CO$, $CO_2/NH_3$, $CO_2/H_2$, $H_2O/H_2$, $H_2O/NH_3$, $H_2O/CO$, Nitrogen, Argon, and vacuum (partial pressure of oxygen $10^{-38}$ atm to $10^{-3}$ atm)
2. Choice of glass constituents such that the thermodynamic activity of silicon dioxide in the glass is less a maximum at which the Gibb's free energy change for the system is zero.

This invention additionally provides methods for processing of platinum metallized high temperature co-fired ceramic (HTCC) components with minimum deleterious formation of volatile platinum oxide products.

The initiation of the undesired effects mentioned above can be traced to the formation of a volatile platinum oxide. The following relationship represents the thermodynamic equilibrium between the metal, oxygen, and gaseous oxide:

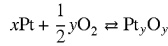

$$x\text{Pt} + \frac{1}{2}yO_2 \rightleftharpoons \text{Pt}_yO_y$$

The desired manipulation of the Gibb's free energy state of the system may be achieved in the following ways:

1. It is preferred to minimize the partial pressure of oxygen as low as possible to limit the thermodynamic tendency for the gaseous platinum oxide formation (i.e. Manipulate the sign of the Gibbs free energy change increasingly positive). An oxygen partial pressure less than $10^{-3}$ atm is desired. However, even though this number is exceeded, it is advantageous to have an oxygen partial pressure less than in atmospheric air.
2. Another approach is to include an additional platinum oxide gas generating source into the furnace during firing of platinum via parts. For example, a prefired ceramic substrate with sputtered platinum layer or a ceramic crucible with fine platinum powder may be used. This would cause additional platinum oxide gas to be formed in the chamber minimizing the degradation of the platinum contained in the fabricated part. The amount and geometric configuration of this 'sacrificial' platinum may be tailored such that degradation occurs preferentially on the 'sacrificial' platinum over the component platinum.

The mechanical system is able to accommodate some deleterious reaction occurring when the oxygen partial pressure is outside a theoretical range either toward the reducing side or the oxidizing size. The degree of the deviation will determine the amount of undesired phenomena. Even moderate changes in the Gibb's free energy state of the system may yield measureable differences in the fabricated part.

Additionally it should be mentioned that temperature is also an important parameter in the firing process. Temperature may also be used to favorably manipulate the free energy state of the reactions.

During the firing and subsequent cooling during the step 44, the ceramic material of the laminated substrate 100 shrinks thereby shrinking via holes 26 around the paste 17 to form a seal. The fine aluminum oxide suspension permits uniform and continuous sealing around the surface of the paste 17. Additionally, at the maximum firing temperature, e.g., 1600° C., the paste 17 being squeezed by the ceramic exhibits sufficient flow to enable the paste 17 to flow and fill any crevices in the ceramic. This action produces a hermetic paste/ceramic interface. Furthermore, the firing step 44 may also cause hermeticity through bonding mechanisms like, for example, sintering, glass melt/wetting, alloying, compounding and/or diffusion solution formation. "Sintering" as used herein is a term used to describe the consolidation of the ceramic material during firing. Consolidation implies that within the ceramic material, particles have joined together into an aggregate that has strength. The term sintering may be used to imply that shrinkage and densification have occurred; although this commonly happens, densification may not always occur. "Sintering" is also a method for making objects from powder, by heating the material (below its melting point) until its particles adhere to each other. "Sintering" is traditionally used for manufacturing ceramic objects, and has also found uses in such fields as powder metallurgy. "Alloying" as used herein refers to an alloy that is a homogeneous hybrid of two or more elements, at least one of which is a metal, and where the resulting material has metallic properties. "Compounding" as used herein refers to a chemical compound that is a substance consisting of two or more elements chemically-bonded together in a fixed proportion by mass. "Diffusion solution formation" as used herein refers is the net movement of particles from an area of high concentration to an area of low concentration. A solid solution is a solid-state solution of one or more solutes in a solvent. Such a mixture is considered a solution rather than a compound when the crystal structure of the solvent remains unchanged by addition of the solutes, and when the mixture remains in a single homogeneous phase. Also, the firing step 44 may also cause solidification of the metallized vias 26 and the ceramic material of the laminated substrate 100 to prevent leaks.

Step 48 of FIG. 3 calls for lapping or grinding the upper and lower surfaces of the fired laminated substrate 100 to remove materials 50 and 51, depicted in FIG. 6B, in order to expose the upper and lower faces of the metallized vias 26. The upper and lower surfaces of the fired laminated substrate 100 may also go through the polishing step 49 so that the metallized vias 26 are flush with the surrounding ceramic material.

After lapping and/or grinding, the fired laminated substrate 100 may be subjected to a hermeticity test, e.g., frequently a helium (He) leak test as represented by step 56 in FIG. 3.

Figure 6D:
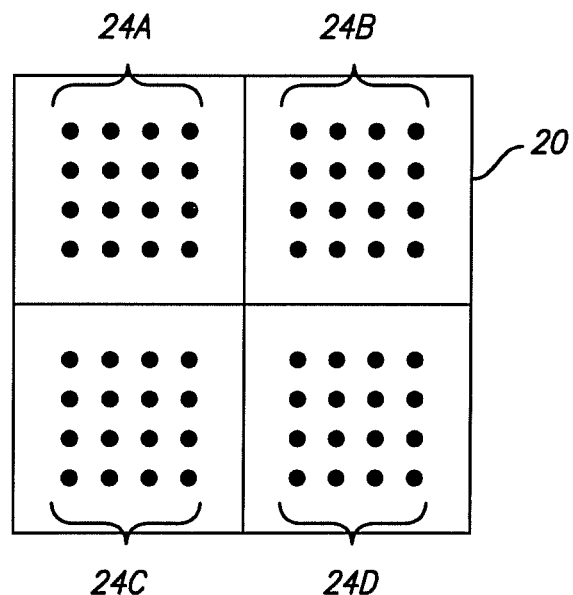
FIGS. 6D-E depict dicing of the substrate to form multiple feedthrough assemblies.
Figure 6E:
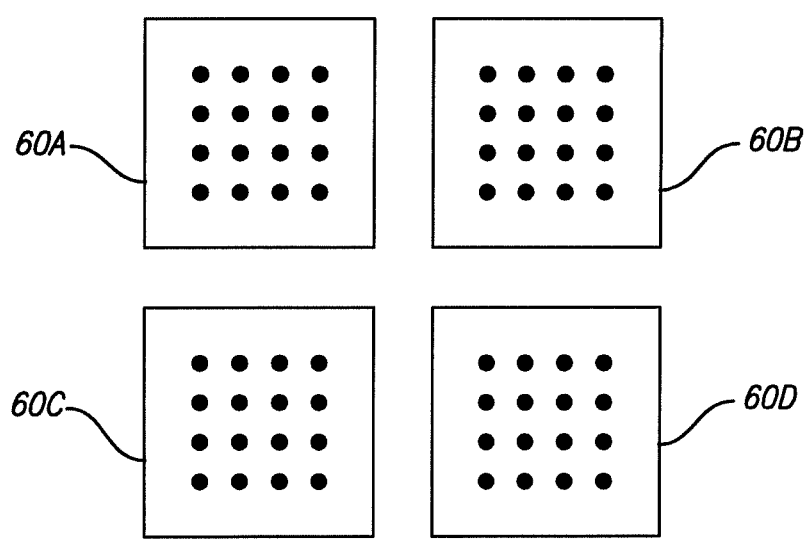

In one exemplary embodiment, sheet/substrate 20 may contain several patterns 24a-d of the via holes 26 as shown in FIG. 6D. In this exemplary embodiment, the fired laminated substrate 100 would contain several patterns 24a-d of the metal filled via holes 26 and the fired laminated substrate 100 would be subjected to a singulation or dicing step 58 to provide multiple feedthrough assemblies 60A, 60B, 60C, 60D shown in FIG. 6E.

Although some embodiments described above employ a ceramic sheet of >90% aluminum oxide ($AlO_2$), alternative embodiments may use other ceramic materials, e.g., zirconium. Because the firing temperature of the ceramic can be tailored within certain limits, the conductive paste 17 may comprise any of the noble metals and/or any of the refractory metals, for example, platinum, titanium, gold, palladum, tantalum, niobium.

As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

From the foregoing, it should now be appreciated that electrical feedthrough assemblies and fabrication methods thereof have been described suitable for use in medical devices intended for implantation in a patient's body. Although a specific structure and fabrication method has been described, it is recognized that variations and modifications will occur to those skilled in the art coming within the spirit and scope of the invention as defined by the appended claims.

Referring to FIGS. 7 through 10, the preferred use for the feedthrough of the present invention is in an implantable hermetic package such as used in a visual prosthesis. An implanted electronic device, such as a visual prosthesis, requires that the electronics be encapsulated in a hermetic biocompatible package that allows for electrical signals to pass through the package with a metalized via.

Figure 7:
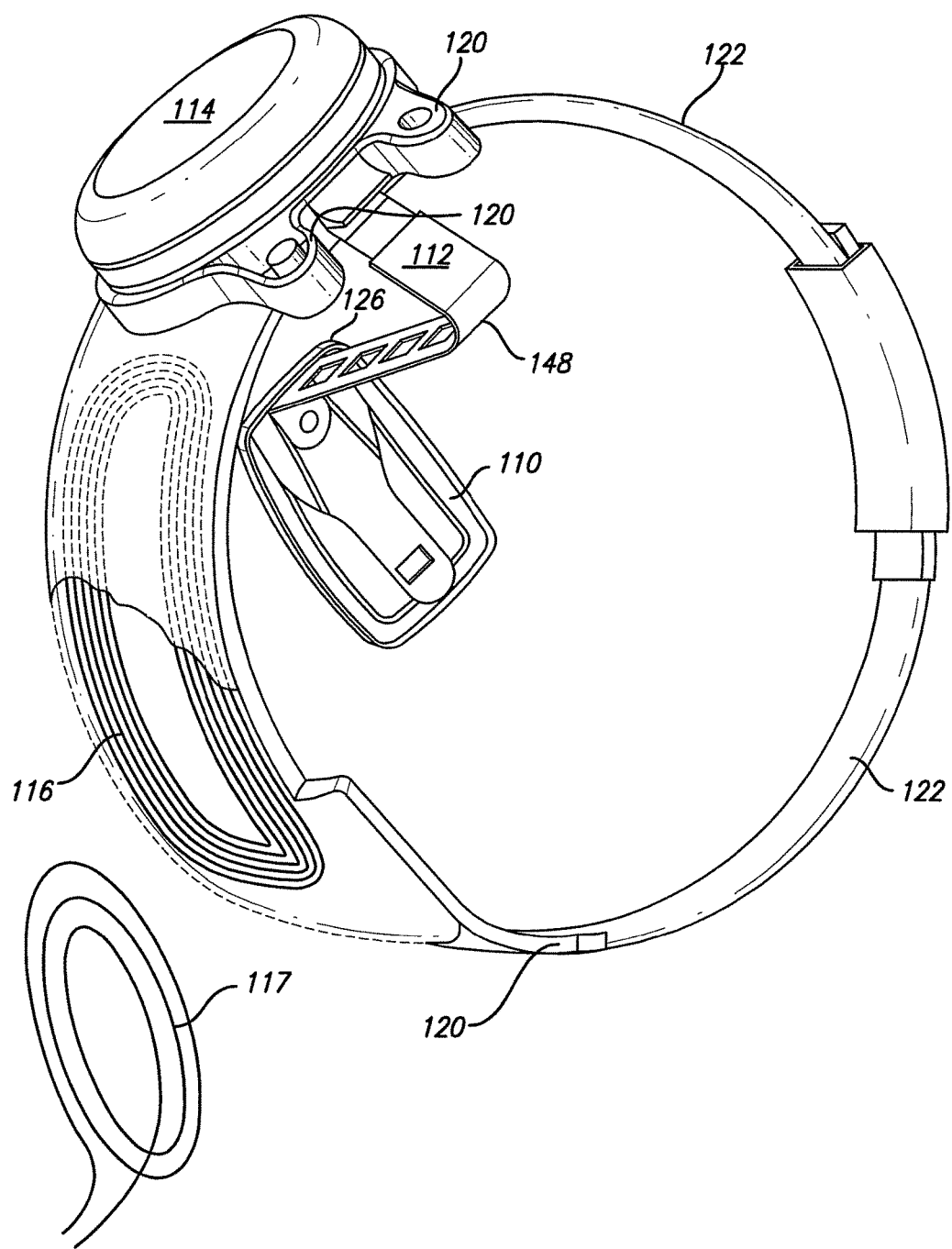
FIG. 7 is a perspective view of the implanted portion of the preferred visual prosthesis.

FIG. 7 shows a perspective view of the implanted portion of the preferred visual prosthesis. A flexible circuit 101 includes a flexible circuit electrode array 110 which is mounted by a retinal tack (not shown) or similar means to the epiretinal surface. The flexible circuit electrode array 110 is electrically coupled by a flexible circuit cable 112, which pierces the sclera and is electrically coupled to an electronics package 114, external to the sclera.

The electronics package 114 is electrically coupled to a secondary inductive coil 116. Preferably the secondary inductive coil 116 is made from wound wire. Alternatively, the secondary inductive coil 116 may be made from a flexible circuit polymer sandwich with wire traces deposited between layers of flexible circuit polymer. The secondary inductive coil receives power and data from a primary inductive coil 117, which is external to the body. The electronics package 114 and secondary inductive coil 116 are held together by the molded body 118. The molded body 118 holds the electronics package 114 and secondary inductive coil 116 end to end. The secondary inductive coil 116 is placed around the electronics package 114 in the molded body 118. The molded body 118 holds the secondary inductive coil 116 and electronics package 114 in the end to end orientation and minimizes the thickness or height above the sclera of the entire device. The molded body 118 may also include suture tabs 120. The molded body 118 narrows to form a strap 122 which surrounds the sclera and holds the molded body 118, secondary inductive coil 116, and electronics package 114 in place. The molded body 118, suture tabs 120 and strap 122 are preferably an integrated unit made of silicone elastomer. Silicone elastomer can be formed in a pre-curved shape to match the curvature of a typical sclera. However, silicone remains flexible enough to accommodate implantation and to adapt to variations in the curvature of an individual sclera. The secondary inductive coil 116 and molded body 118 are preferably oval shaped. A strap 122 can better support an oval shaped coil. It should be noted that the entire implant is attached to and supported by the sclera. An eye moves constantly. The eye moves to scan a scene and also has a jitter motion to improve acuity. Even though such motion is useless in the blind, it often continues long after a person has lost their sight. By placing the device under the rectus muscles with the electronics package in an area of fatty tissue between the rectus muscles, eye motion does not cause any flexing which might fatigue, and eventually damage, the device.

Figure 8:
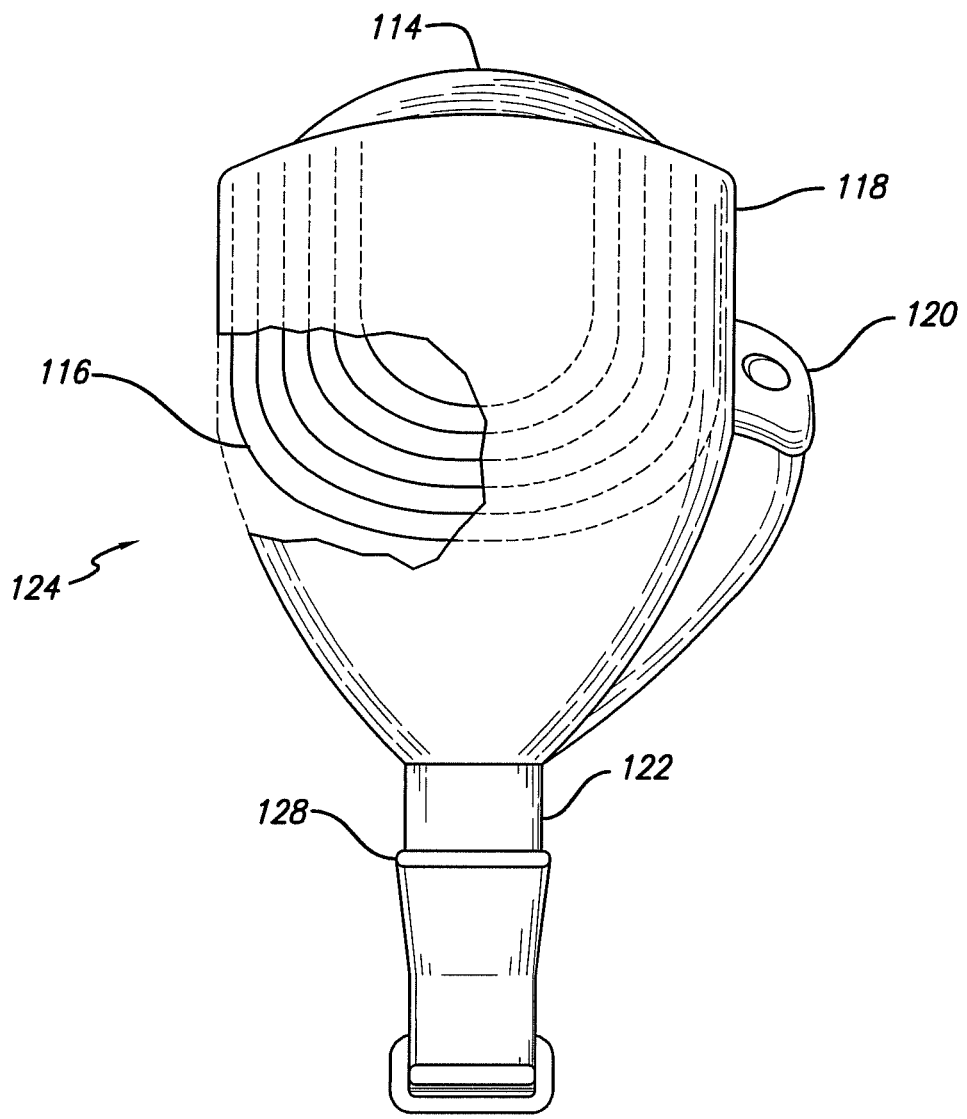
FIG. 8 is a side view of the implanted portion of the preferred visual prosthesis showing the fan tail in more detail.

FIG. 8 shows a side view of the implanted portion of the visual prosthesis, in particular, emphasizing the fan tail 124. When implanting the visual prosthesis, it is necessary to pass the strap 122 under the eye muscles to surround the sclera. The secondary inductive coil 16 and molded body 118 must also follow the strap 122 under the lateral rectus muscle on the side of the sclera. The implanted portion of the visual prosthesis is very delicate. It is easy to tear the molded body 118 or break wires in the secondary inductive coil 116. In order to allow the molded body 118 to slide smoothly under the lateral rectus muscle, the molded body 118 is shaped in the form of a fan tail 124 on the end opposite the electronics package 114. The strap 122 further includes a hook 128 the aids the surgeon in passing the strap under the rectus muscles.

Figure 9:
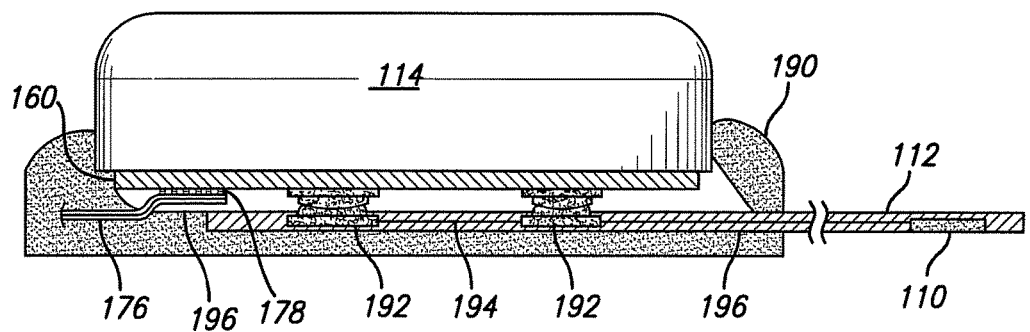
FIG. 9 is a view of the completed package attached to an electrode array.

Referring to FIG. 9, the flexible circuit 101, includes platinum conductors 194 insulated from each other and the external environment by a biocompatible dielectric polymer 196, preferably polyimide. One end of the array contains exposed electrode sites that are placed in close proximity to the retinal surface 10. The other end contains bond pads 192 that permit electrical connection to the electronics package 114. The electronic package 114 is attached to the flexible circuit 101 using a flip-chip bumping process, and epoxy underfilled. In the flip-chip bumping process, bumps containing conductive adhesive placed on bond pads 192 and bumps containing conductive adhesive placed on the electronic package 114 are aligned and melted to build a conductive connection between the bond pads 92 and the electronic package 114. Leads 176 for the secondary inductive coil 116 are attached to gold pads 178 on the ceramic substrate 160 using thermal compression bonding, and are then covered in epoxy. The electrode array cable 112 is laser welded to the assembly junction and underfilled with epoxy. The junction of the secondary inductive coil 116, array 101, and electronic package 114 are encapsulated with a silicone overmold 190 that connects them together mechanically. When assembled, the hermetic electronics package 114 sits about 3 mm away from the end of the secondary inductive coil.

Since the implant device is implanted just under the conjunctiva it is possible to irritate or even erode through the conjunctiva. Eroding through the conjunctiva leaves the body open to infection. We can do several things to lessen the likelihood of conjunctiva irritation or erosion. First, it is important to keep the over all thickness of the implant to a minimum. Even though it is advantageous to mount both the electronics package 114 and the secondary inductive coil 116 on the lateral side of the sclera, the electronics package 114 is mounted higher than, but not covering, the secondary inductive coil 116. In other words the thickness of the secondary inductive coil 116 and electronics package should not be cumulative.

It is also advantageous to place protective material between the implant device and the conjunctiva. This is particularly important at the scleratomy, where the thin film electrode array cable 112 penetrates the sclera. The thin film electrode array cable 112 must penetrate the sclera through the pars plana, not the retina. The scleratomy is, therefore, the point where the device comes closest to the conjunctiva. The protective material can be provided as a flap attached to the implant device or a separate piece placed by the surgeon at the time of implantation. Further material over the scleratomy will promote healing and sealing of the scleratomy.

Suitable materials include DACRON®, TEFLON®, GORE-TEX® (ePTFE), TUTOPLAST® (sterilized sclera), MERSILENE® (polyester) or silicone.

Figure 10:
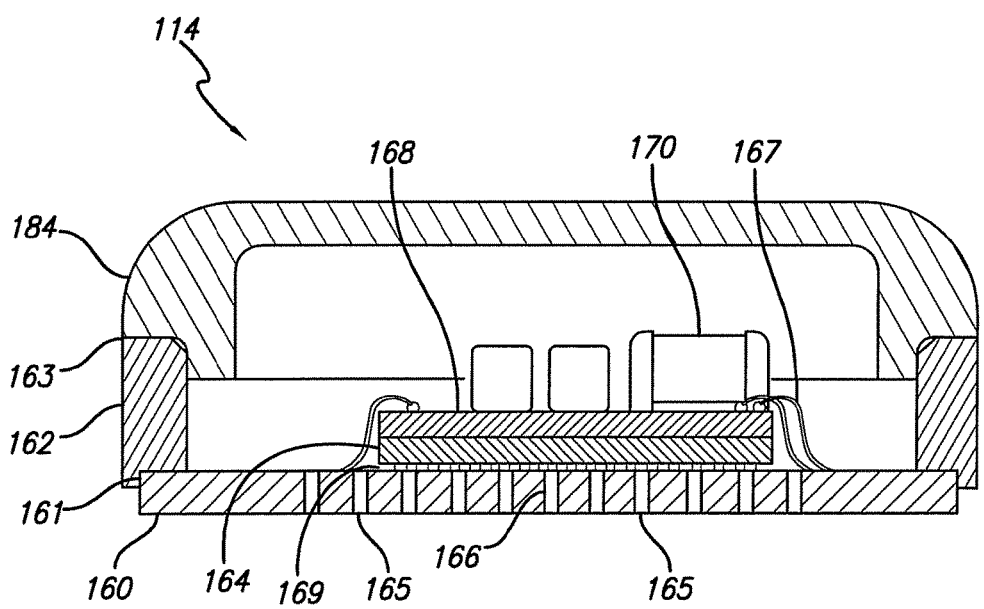
FIG. 10 is a cross-section of the package.

Referring to FIG. 10, the package 114 contains a ceramic substrate 160, with metalized vias 165 and thin-film metallization 166. The package 114 contains a metal case wall 62 which is connected to the ceramic substrate 60 by braze joint 161. On the ceramic substrate 160 an underfill 169 is applied. On the underfill 169 an integrated circuit chip 164 is positioned. On the integrated circuit chip 64 a ceramic hybrid substrate 168 is positioned. On the ceramic hybrid substrate 168 passives 170 are placed. Wirebonds 167 are leading from the ceramic substrate 60 to the ceramic hybrid substrate 168. A metal lid 184 is connected to the metal case wall 162 by laser welded joint 163 whereby the package 114 is sealed.

Accordingly, what has been shown is an improved method making a neural electrode array and improved method of stimulating neural tissue. While the invention has been described by means of specific embodiments and applications thereof, it is understood that numerous modifications and variations could be made thereto by those skilled in the art without departing from the spirit and scope of the invention. It is therefore to be understood that within the scope of the claims, the invention may be practiced otherwise than as specifically described herein.

What is claimed is:

1. A method of fabricating a hermetic electrical feedthrough, the method comprising:
   providing a ceramic sheet, and having an upper surface and a lower surface, wherein said sheet includes silicon dioxide;
   forming at least one via hole in said sheet extending from said upper surface to said lower surface;
   inserting a conductive thickfilm paste, including platinum, into said via hole;
   laminating said sheet with said conductive thick film paste in said via hole between an upper ceramic sheet, and a lower ceramic sheet, to form a laminated substrate wherein said via hole is encased in ceramic;
   selecting an oxygen controlled environment, between $10^{-38}$ and $10^{-3}$ atmospheres of oxygen partial pressure, by introduction of other gasses selected from the group consisting of $CO_2/CO$, $CO_2/NH_3$, $CO_2/H_2$, $H_2O/H_2$, $H_2O/NH_3$, $H_2O/CO$, Nitrogen, or Argon, under vacuum to balance platinum oxidation and silicon dioxide decomposition of said laminated substrate;
   firing said laminated substrate in said oxygen controlled environment to a temperature to sinter said laminated substrate to form a single sintered structure and cause said conductive thick film paste in said via hole to form a metallized via, including platinum in contact with ceramic, and cause said laminated substrate to form a fired laminated substrate and a hermetic seal around said metallized via; and
   removing said upper sheet material and said lower sheet material by lapping or grinding, to expose an upper and a lower surface of said metallized via.

2. The method according to claim 1, wherein said oxygen controlled environment is a vacuum.

3. The method according to claim 1, wherein said sheet is formed of material comprised of at least 90% aluminum oxide.

4. The method according to claim 1, wherein said fired laminated substrate after said firing and material removal steps is less than or equal to 40 mils thick.

5. The method according to claim 1, wherein said fired laminated substrate after said firing and material removal steps is less than 15 mils thick.

6. The method according to claim 1, wherein forming at least one via hole in said sheet comprises punching said via hole using a punch tool, etching said via hole using a solvent etching, using laser ablation or drilling said via hole.

7. The method according to claim 1, wherein inserting a conductive material into said via hole comprises:
   disposing said sheet with said via hole between a stencil layer and a vacuum base, wherein said stencil layer includes at least one through hole that is aligned above said via hole;
   rolling said conductive material across said stencil layer; and
   pulling said conductive material into said via hole through said hole in said stencil layer with a vacuum created by said vacuum base.

8. The method according to claim 1, further comprising laminating said sheet with paste filled via holes between said upper sheet and said lower sheet to form said laminated substrate;
   placing said sheet with paste filled via holes together with said upper ceramic sheet and said lower ceramic sheet in a heatpress; and
   applying heat and pressure by said heatpress until said laminated substrate is formed.

9. The method according to claim 1, wherein said ceramic material comprises aluminum oxide, zirconium oxide or a mixture thereof.

10. The method according to claim 1, wherein said fired laminated substrate has a thickness of less than 20 mils after removing said upper ceramic sheet and said lower ceramic sheet material.

11. The method according to claim 1, wherein said fired laminated substrate has a thickness of 15-20 mils after removing said upper ceramic sheet and said lower ceramic sheet material.

12. A method of fabricating a hermetic electrical feedthrough, the method comprising:
   providing a ceramic sheet and having an upper surface and a lower surface, wherein said sheet includes silicon dioxide;
   forming at least one via hole in said sheet extending from said upper surface to said lower surface;
   inserting a conductive thickfilm paste including platinum into said via hole forming a substrate;
   selecting an oxygen controlled environment between $10^{-38}$ and $10^{-3}$ atmospheres of oxygen, the partial pressure of oxygen controlled by introduction of other gasses, selected from the group consisting of $CO_2/CO$, $CO_2/NH_3$, $CO_2/H_2$, $H_2O/H_2$, $H_2O/NH_3$, $H_2O/CO$, Nitrogen, or Argon, under vacuum to balance platinum oxidation and silicon dioxide decomposition of said substrate; and
   firing said substrate to a temperature to sinter said sheet and cause said conductive thick film paste in said via hole to form a metallized via, including ceramic and platinum, and cause said sheet to form a hermetic seal around said metallized via.

13. The method according to claim 12, wherein said oxygen controlled environment is a vacuum.

14. The method according to claim 12, wherein said sheet is formed of material comprised of at least 90% aluminum oxide.

15. The method according to claim 12, wherein said sheet after said firing is less than 15 mils thick.

16. The method according to claim 12, wherein inserting a conductive material into said via hole comprises:
- disposing said sheet with the via hole between a stencil layer and a vacuum base, wherein said stencil layer includes at least one through hole that is aligned above said via hole;
- rolling said conductive material across said stencil layer; and
- pulling said conductive material into said via hole through said hole in said stencil layer with a vacuum created by said vacuum base.

* * * * *